United States Patent
Koch et al.

(10) Patent No.: US 9,577,605 B2
(45) Date of Patent: Feb. 21, 2017

(54) RF COMPONENT WITH REDUCED COUPLING AND SUITABLE FOR MINIATURIZATION

(71) Applicant: EPCOS AG, Munich (DE)

(72) Inventors: Robert Koch, Munich (DE); Jürgen Kiwitt, Munich (DE); Maximilian Pitschi, Rottach-Egern (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/784,201

(22) PCT Filed: Apr. 15, 2014

(86) PCT No.: PCT/EP2014/057627
§ 371 (c)(1),
(2) Date: Oct. 13, 2015

(87) PCT Pub. No.: WO2014/180633
PCT Pub. Date: Nov. 13, 2014

(65) Prior Publication Data
US 2016/0072476 A1     Mar. 10, 2016

(30) Foreign Application Priority Data
May 10, 2013   (DE) .......................... 10 2013 104 842

(51) Int. Cl.
*H03H 9/54* (2006.01)
*H03H 9/64* (2006.01)
(Continued)

(52) U.S. Cl.
CPC .......... *H03H 9/568* (2013.01); *H01F 27/2823* (2013.01); *H01F 38/14* (2013.01);
(Continued)

(58) Field of Classification Search
CPC ...... H01F 27/2823; H01F 38/14; H03H 3/013; H03H 9/02818; H03H 9/462; H03H 9/568; H03H 9/605; H03H 9/6489; H03H 9/725; H03H 9/706; H03H 9/02086; H03H 9/6843
(Continued)

(56) References Cited

U.S. PATENT DOCUMENTS

| | | | |
|---|---|---|---|
| 6,426,683 B1 | 7/2002 | Gu et al. | |
| 6,927,649 B2 * | 8/2005 | Metzger | H03H 9/0557 333/133 |

(Continued)

FOREIGN PATENT DOCUMENTS

| | | |
|---|---|---|
| DE | 102010008774 A1 | 8/2011 |
| DE | 102012112571 B3 | 6/2014 |

(Continued)

*Primary Examiner* — Barbara Summons
*Assistant Examiner* — Jorge Salazar, Jr.
(74) *Attorney, Agent, or Firm* — Slater Matsil, LLP

(57) ABSTRACT

An RF component can have a reduced electromagnetic internal coupling and may be suitable for miniaturization as a result. The component includes a micro acoustic filter of ladder-type design in a housing and a double coil having a first coil segment and a second coil segment. The two coil segments are oriented in opposite directions. The two coil segments are arranged without crossover in one layer and the double coil is arranged in proximity to a parallel branch resonator of the ladder-type filter structure.

18 Claims, 9 Drawing Sheets

(51) Int. Cl.
*H01F 27/28* (2006.01)
*H01F 38/14* (2006.01)
*H03H 3/013* (2006.01)
*H03H 9/56* (2006.01)
*H03H 9/02* (2006.01)
*H03H 9/60* (2006.01)
*H03H 9/46* (2006.01)
*H03H 9/70* (2006.01)
*H03H 9/72* (2006.01)

(52) U.S. Cl.
CPC ........ *H03H 3/013* (2013.01); *H03H 9/02086* (2013.01); *H03H 9/02818* (2013.01); *H03H 9/462* (2013.01); *H03H 9/605* (2013.01); *H03H 9/6483* (2013.01); *H03H 9/6489* (2013.01); *H03H 9/706* (2013.01); *H03H 9/725* (2013.01)

(58) Field of Classification Search
USPC ................ 333/133, 185, 187, 188, 193–196
See application file for complete search history.

(56) References Cited

U.S. PATENT DOCUMENTS

| | | | |
|---|---|---|---|
| 7,053,731 B2* | 5/2006 | Iwamoto | H03H 9/0576 333/133 |
| 7,151,430 B2 | 12/2006 | Mattsson | |
| 7,479,846 B2* | 1/2009 | Inoue | H03H 9/0576 333/133 |
| 8,436,697 B2 | 5/2013 | Takamine | |
| 9,019,045 B2 | 4/2015 | Maurer | |
| 2005/0237144 A1 | 10/2005 | Einzinger et al. | |
| 2006/0139125 A1* | 6/2006 | Shiga-ken | H03H 9/0557 333/193 |
| 2006/0226943 A1 | 10/2006 | Marques | |
| 2009/0147707 A1 | 6/2009 | Koga et al. | |
| 2010/0026419 A1 | 2/2010 | Hara et al. | |
| 2011/0037535 A1* | 2/2011 | Kitamura | H03H 9/0566 333/134 |
| 2011/0254639 A1 | 10/2011 | Tsutsumi et al. | |
| 2012/0286896 A1 | 11/2012 | Takamine | |
| 2012/0326808 A1 | 12/2012 | Moreno Granado et al. | |

FOREIGN PATENT DOCUMENTS

| | | |
|---|---|---|
| JP | 7263995 A | 10/1995 |
| WO | 2005117255 A1 | 12/2005 |
| WO | 2011009868 A1 | 1/2011 |
| WO | 2011092879 A1 | 8/2011 |
| WO | 2011101314 A1 | 8/2011 |
| WO | 2012176576 A1 | 12/2012 |

* cited by examiner

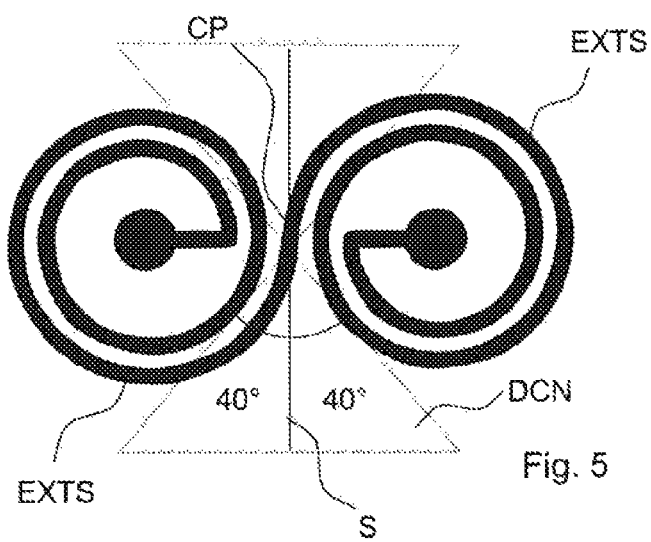
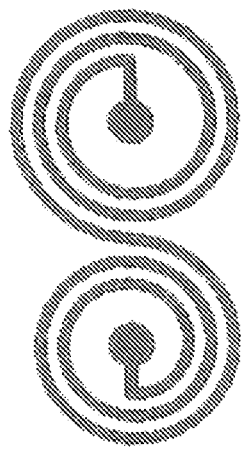
Fig. 5
Fig. 6
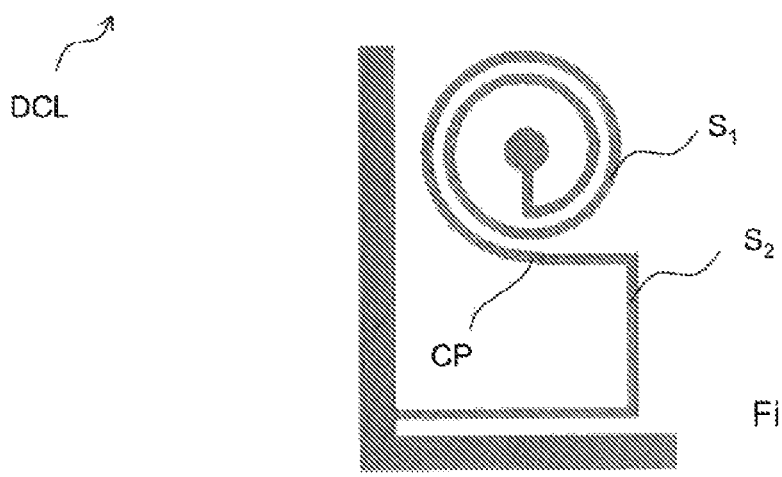
Fig. 7
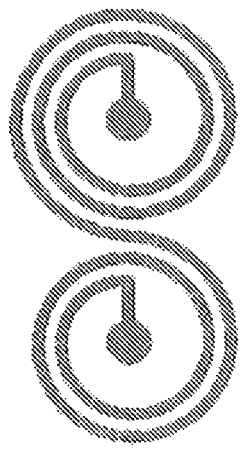
Fig. 8
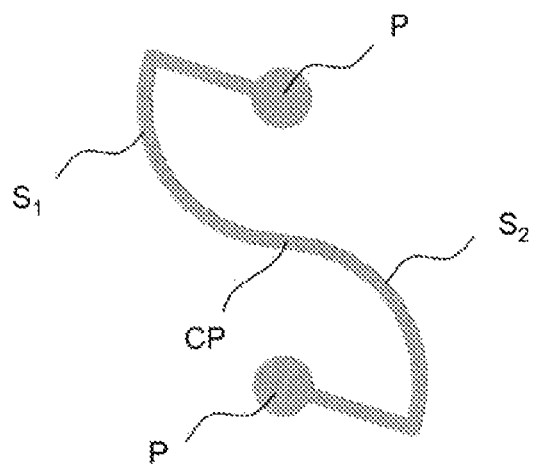
Fig. 9

RF COMPONENT WITH REDUCED COUPLING AND SUITABLE FOR MINIATURIZATION

This patent application is a national phase filing under section 371 of PCT/EP2014/057627, filed Apr. 15, 2014, which claims the priority of German patent application 10 2013 104 842.0, filed May 10, 2013, each of which is incorporated herein by reference in its entirety.

TECHNICAL FIELD

The invention relates to RF components that have a reduced electromagnetic, e.g., inductive, coupling and are highly suitable for miniaturization as a result.

BACKGROUND

The continuous trend toward the miniaturization of RF components imposes particular requirements with regard to the mutual couplings of circuit parts in the component. The distances between the circuit parts decrease as a result of a miniaturized design. As a result, undesired signal components from one part can be more easily coupled into another part. If duplexers, for example, were miniaturized without further measures, then the isolation would be impaired. Starting from a critical value for the isolation, the miniaturization would no longer be possible since the duplexer would then no longer be able to fulfill predefined requirements with regard to the isolation.

U.S. Patent Application Publication No. 2011/0254639A1 discloses arranging a capacitive element between antenna connection or receiving connection of a duplexer or between transmitting connection and receiving connection in order to reduce crosstalk.

International Patent Publication No. WO 2011/092879A1 discloses a coil at a transmitting connection. In this case, the coil is arranged on the substrate in such a way that it becomes located alongside its filter-topologically adjacent resonators.

U.S. Pat. No. 7,151,430B2 discloses a coil structure for reducing an inductive coupling. In this case, the coil has regions in which parts of the coil turn overlap other parts.

International Patent Publication No. WO 2011/101314 discloses micro acoustic filters having a Figure eight current loop.

The documents cited above specify measures for reducing electromagnetic coupling, but are technically relatively complex to realize.

SUMMARY

The invention relates to RF components which have a reduced electromagnetic, e.g. inductive, coupling and are highly suitable for miniaturization as a result. Such reduced couplings are advantageous particularly in the case of RF filters.

Embodiments of the present invention to specify an RF component having reduced coupling, wherein the component is producible in a simple manner. Further embodiments specify a method for producing a corresponding component.

The RF component comprises a housing and also a micro acoustic filter having a ladder-type filter structure arranged in the housing. In this case, the ladder-type filter structure comprises at least one series branch resonator and a parallel branch resonator. The component furthermore comprises a double coil having a first coil segment and a second coil segment. The double coil is likewise arranged in the housing. The first coil segment has an external turn segment having a first orientation. The second coil segment likewise has an external turn segment, furthermore having a second orientation in the opposite direction with respect to the first orientation. The two external turn segments are connected at a contact point. The two coil segments are arranged without crossover in a single layer. The double coil is arranged in proximity to the parallel branch resonator.

The orientation of the two coil segments in opposite directions brings about a reduction of the electromagnetic coupling at least in a region arranged in proximity to the double coil. In general, the double coil even produces a reduction of the coupling in two regions, wherein the coil is arranged substantially in the center between the regions.

In this case, a coil is a conductor, e.g., a winding, which is suitable for generating a magnetic field. In this case, each of the two coil segments can have a winding having a number of turns. In this case, the number of turns specifies how often the conductor is led around a center of the coil segment. In this case, the number of turns can assume whole numbers greater than zero. However, the number of turns is not restricted to whole numbers, but rather can also assume rational or real values.

RF components comprising micro acoustic filters are per se already highly suitable for miniaturization since micro acoustic filters, e.g., SAW (SAW=surface acoustic wave), BAW (BAW=bulk acoustic wave) or GBAW (GBAW=guided bulk acoustic wave) components have good isolation values in conjunction with a small structural size. It has been recognized that a double coil is able to reduce the coupling in a region near the coil. Furthermore, it has been recognized that specific structural parts of RF components, in particular of small structural parts operating with acoustic waves, react particularly sensitively to a signal coupling in and therefore require special protective measures. It has furthermore been recognized that the double coil is a suitable means for protecting particularly sensitive structural parts. By virtue of the fact that the double coil is arranged in proximity to the parallel branch resonator, it can easily be aligned such that the regions of reduced coupling overlap at least one region having a sensitive component.

In this case, the double coil itself can constitute an inductive element which is required anyway filter-topologically, e.g., as an impedance matching element or as an ESD protection element. In this case, the double coil is not an additional element, and so the advantage with regard to the reduced structural size as a result of the arrangement of the coil is not used up by the space required by the coil itself.

In one embodiment, at least one of the two coil segments is embodied in a spiral fashion. It is also possible for both coil segments to be embodied in a spiral fashion. In this context, the term "spiral" denotes a coil shape in which the conductor follows a path and the distance of the path, e.g., as viewed in the current direction, substantially runs around a center of the coil and the distance increases or decreases monotonically. It is possible for the distance along the path to increase or decrease not only monotonically, but even strictly monotonically.

In one embodiment, at least one of the two coil segments is constructed with an m-gonal basic contour or from n rectilinear conductor sections. In this case m and n can be greater than or equal to three. Furthermore, it is possible for at least one of the coil segments to have a curved path. The curvature can then increase or decrease monotonically or strictly monotonically.

In this case, the m-gonal basic contour can have three, four, five, six, seven, eight, nine, ten, eleven, twelve or even more vertices. The number of rectilinear conductor sections, n, can substantially be defined by the number m of vertices of the basic contour multiplied by the number of turns. If the coil segment does not have an m-gonal basic contour, the number of rectilinear conductor sections can be between five and 80.

It is furthermore possible for both coil segments to be constructed from rectilinear conductor sections and/or with an m-gonal basic contour.

It is furthermore possible for one coil segment or both segments to run along a curved path.

In one embodiment, at least one of the two coil segments has an aspect ratio of substantially less than 1, equal to 1 or greater than 1.

In this case, the aspect ratio is substantially the ratio of length/width of a partial coil. In this case, the length is determined in a direction parallel to the connecting line of the two centers of the coil segments. The width is determined in a direction perpendicular thereto. If, e.g., one coil segment is a spiral having a large number of turns, a narrow conductor track and a narrow distance between the turns, then the aspect ratio for large numbers of turns tends toward 1.

It is possible for both coil segments to have the same aspect ratio or different aspect ratios. It is also possible for one coil segment to have an aspect ratio of less than 1 and the other coil segment to have an aspect ratio of greater than 1.

In the case of an aspect ratio of >1, a smaller width of the double coil can be obtained, such that a possible disadvantageous overlap between the double coil and other circuit constituents is reduced.

In one embodiment, the first coil segment has a first extent while the second coil segment has a second extent. In this case the second extent can be substantially equal to the first extent or larger or smaller. In this case, the term "extent" denotes the smallest area within which all the conductor track sections of a coil segment run. The shape and the size of the extents of the two coil segments and also the course of the coils within the extents in this case substantially determine the shape and the strength of an electromagnetic field that can be generated by the coil. Therefore, the extents are critically crucial to how well the coupling is reduced by the double coil.

In one embodiment, the two numbers of turns of the two coil segments are identical or different. The numbers of turns can be chosen arbitrarily to be substantially between 0.25 and 100, in each case independently of one another.

In one embodiment, the first coil segment has a center and the second coil segment has a center. An axis that is perpendicular to a connecting line through both centers and runs through the contact point defines a region of reduced electromagnetic coupling in a region around said axis.

It is possible for the region of reduced electromagnetic coupling to be a double cone, e.g., if the two coil segments are embodied symmetrically or virtually symmetrically. A component function that is sensitive toward inductive coupling is arranged in the region of the double cone—or more generally: in the region of reduced electromagnetic coupling.

In this case, the region of the double cone is substantially characterized in that the magnetic fields generated by the two coil segments mutually compensate for one another, such that a region of reduced coupling, the double cone, is obtained.

Particularly sensitive component functions, e.g., DMS structures (DMS=double mode SAW) in filters operating with acoustic waves, can be arranged in said region.

In one embodiment, the double cone has a half opening angle $\alpha$, wherein $\alpha$ is between 0° and 50°. It is possible, in particular, for the opening angle $\alpha$ to be equal to 40°.

In a method for producing an electrical RF component, both coil segments are formed in a common layer. This is easily possible since the double coil is arranged in a single layer.

In one embodiment of the component and/or of the method, the common layer comprises two or more plies arranged one above another.

It is possible to position the double coil in the housing in such a way that a coupling of a transmission filter into a reception output routed in a balanced manner is reduced if the component is a duplexer.

The double coil can have a point symmetry with the contact point as the center of symmetry or a mirror symmetry with a mirror axis through the contact point. It is also possible, however, for the double coil to be shaped asymmetrically. In this regard, e.g., the number of turns per coil segment can be different.

It is possible to produce the double coil by means of a single-layer process.

BRIEF DESCRIPTION OF THE DRAWINGS

The RF component is explained in greater detail below on the basis of exemplary embodiments and associated schematic figures, in which:

FIG. 5 shows the region of the double cone relative to the orientation of the double coil;

FIG. 6 shows one possible embodiment of the double coil;

FIG. 7 shows an alternative embodiment of the double coil;

FIG. 8 shows an alternative embodiment of the double coil;

FIG. 9 shows an alternative embodiment of the double coil;

DETAILED DESCRIPTION OF ILLUSTRATIVE EMBODIMENTS

Figure 1:
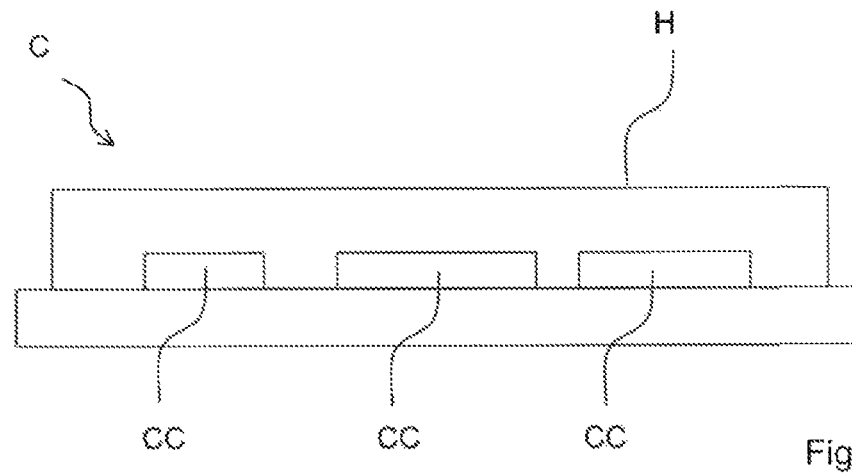
FIG. 1 shows a cross section through a housing H of the component C.

FIG. 1 shows a cross section through a component C. Component constituents CC are arranged in a housing H. The component constituents CC can be filter constituents operating with acoustic waves, for example. As a result of the continuous trend toward miniaturization, the distances between the component constituents CC are decreasing, with the coupling thus increasingly posing a problem. One of the constituents CC can now comprise a double coil, as described above, and thereby bring about a region of reduced coupling, such that a further miniaturization is possible.

Figure 2:
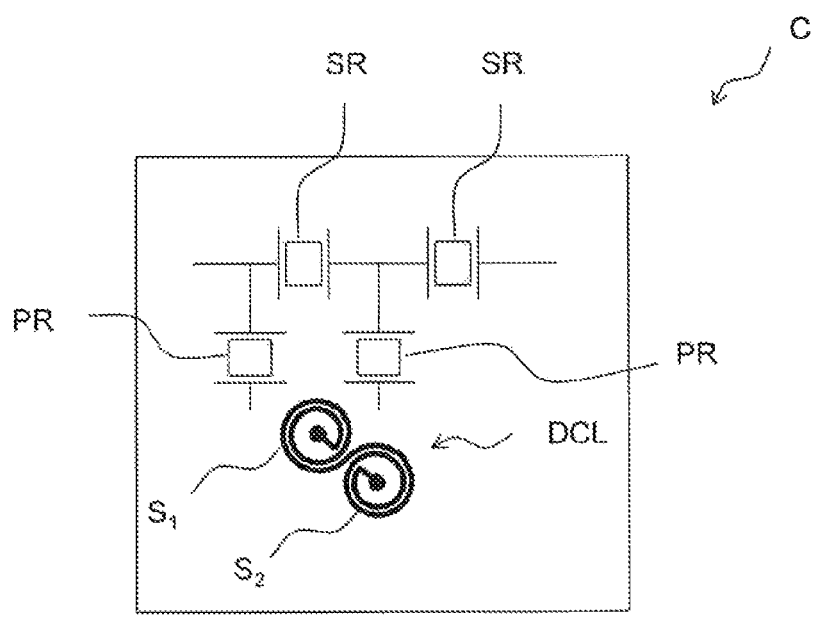
FIG. 2 shows a possible arrangement of the double coil relative to a parallel resonator.

FIG. 2 shows one configuration of a component C comprising a ladder-type filter circuit. The ladder-type filter circuit comprises two series branch resonators interconnected in series. Furthermore, the filter circuit comprises two parallel resonators PR, which can in each case establish a connection of the series branch to ground. A double coil DCL is arranged in proximity to one parallel branch resonator PR and aligned such that the right hand one of the two series resonators SR is arranged in the region of a double cone. The double coil DCL in this case comprises a first coil segment $S_1$ and a second coil segment $S_2$. The two coil segments are oriented in opposite directions, based on the current flow direction.

Figure 3:
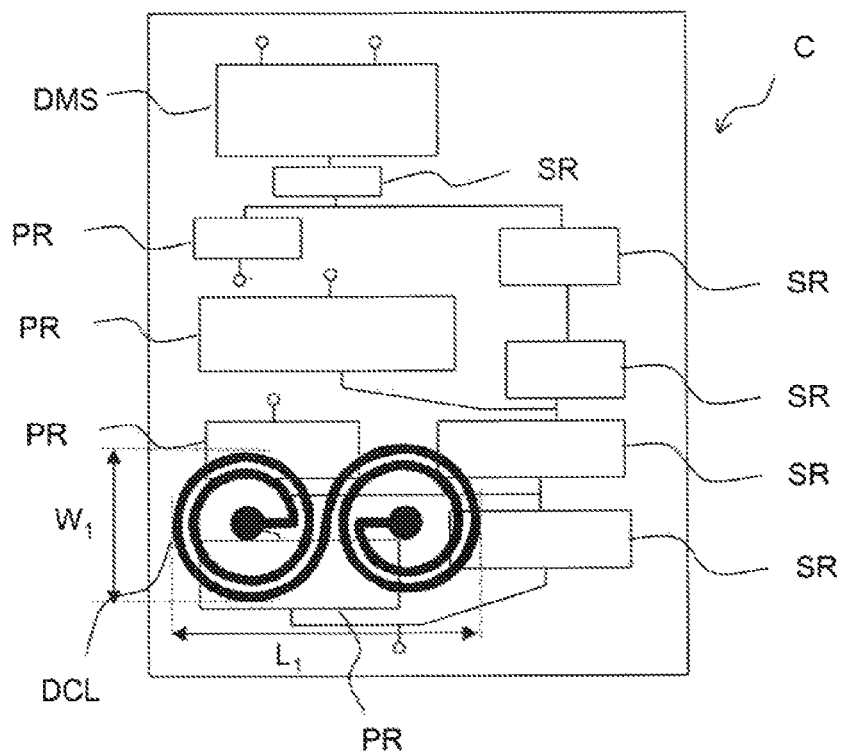
FIG. 3 shows a component C, wherein the double coil has an aspect ratio of substantially 1.

FIG. 3 shows a component C comprising a double coil DCL and a ladder-type filter structure. The ladder-type filter structure comprises five series branch resonators SR and four parallel branch resonators PR. The double coil DCL is arranged in proximity to the bottommost parallel resonator PR. A DMS structure DMS is arranged in a manner connected to the topmost series resonator SR. In this case, the double coil DCL is arranged and oriented relative to the DMS structure DMS such that the DMS structure DMS lies in a region of reduced coupling of the coil DCL. DMS structures can be interconnected in particular with an RX output of a duplexer and forward a received signal to a low noise amplifier. The coupling of undesired signals into a DMS structure would therefore be particularly critical.

In this case, the double coil DCL has a length $L_1$ and a width $W_1$. In this case, the length is determined in the direction of a connecting line between the centers of the coil segments. The width is determined in a direction orthogonal thereto. Half of the length of the double coil, that is to say substantially the length of a coil segment, is used for defining the aspect ratio. The coil segments of the double coil in FIG. 3 substantially have an aspect ratio of 1.

Figure 4:
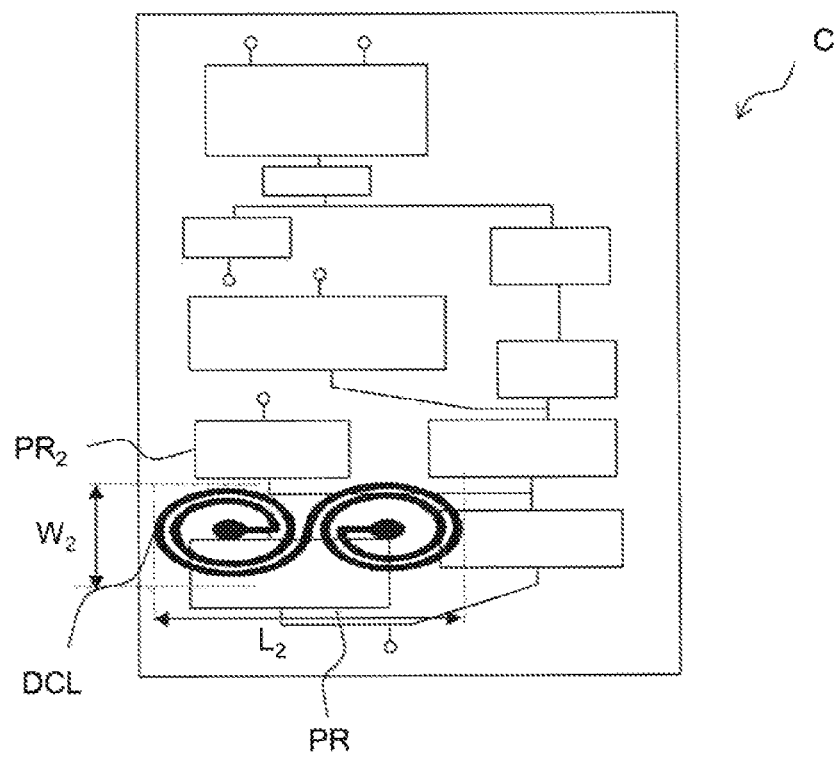
FIG. 4 shows a component C, wherein the double coil has an aspect ratio of greater than 1.

FIG. 4 shows one embodiment of the component C, wherein the coil segments of the double coil have an increased aspect ratio. The length $L_2$ substantially corresponds to the length of the double coil in FIG. 3. The width $W_2$ of the double coil in FIG. 4 is reduced compared with the width $W_1$ of the double coil in FIG. 3. This results in an increased aspect ratio. Consequently, the overlap with the parallel resonator $PR_2$ is reduced.

FIG. 5 illustrates the alignment of the double cone relative to the alignment of the double coil. The coil segments in each case have an external turn segment EXTS, which are connected to one another at a contact point CP. The double cone DCN has an axis S of symmetry that is orthogonal to the connecting line of the centers of the coil segments. The double cone can have an opening angle of 2×40°, that is to say a half opening angle of 40°. The electromagnetic coupling, in particular the inductive coupling, is reduced in the region of the double cone. Components that are arranged in this double cone experience less inductive crosstalk resulting from current through the double coil.

FIG. 6 shows one embodiment of the double coil, wherein the lower coil segment has a number of turns of 2.5 and the upper coil segment has a number of turns of 2.5.

FIG. 7 shows one configurational form of the double coil, wherein the upper coil segment $S_1$ has a number of turns of 2 and the lower coil segment $S_2$ has a number of turns of substantially 0.75.

FIG. 8 shows one configuration of the double coil, wherein the upper coil segment has a number of turns of 2.5 and the lower coil segment has a number of turns of 2.

FIG. 9 shows one configuration of the double coil, wherein the upper coil segment $S_1$ and the lower coil segment $S_2$ have numbers of turns of in each case close to above 0.25. The double coil can be interconnected with further circuit constituents via an input and respectively output port P. In this regard, the double coil can be interconnected, e.g., with a parallel resonator of the ladder-type filter structure.

Figure 10:
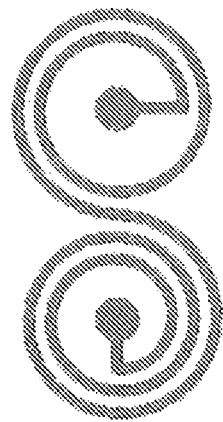
FIG. 10 shows an alternative embodiment of the double coil.

FIG. 10 shows one embodiment, wherein the upper coil segment has a number of turns of 1.75 and the lower coil segment has a number of turns of 2.5.

Figure 11:
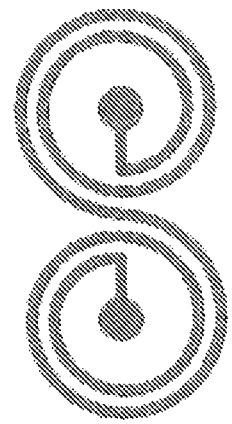
FIG. 11 shows an alternative embodiment of the double coil.

FIG. 11 shows one embodiment, wherein both the upper coil segment and the lower coil segment have a number of turns of 2.

Figure 12:
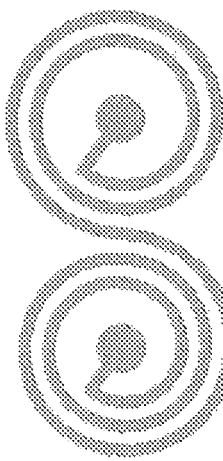
FIG. 12 shows an alternative embodiment of the double coil.

FIG. 12 shows one configuration of the double coil, wherein the upper coil segment has a number of turns of 2.125 and the lower coil segment has a number of turns of 2.625.

Figure 13:
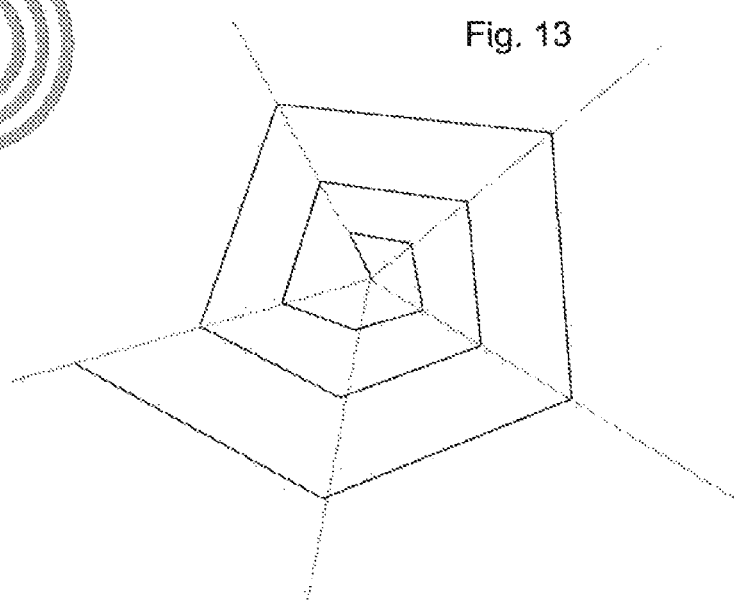
FIG. 13 shows a configuration of a coil segment having a pentagonal basic contour.

FIG. 13 shows one configuration of a coil segment which has a pentagonal basic contour and comprises 15 rectilinear conductor segments. The innermost, shortest conductor segment in this case is aligned radially and does not contribute to the number of turns.

In total, the number of turns of the coil segment in FIG. 13 is 2.8.

It is possible for the m-gonal basic contour, here the pentagonal basic contour, to be based on a symmetrical m-gon. However, it is also possible for the basic contour to be based on an asymmetrical m-gon.

Figure 14:
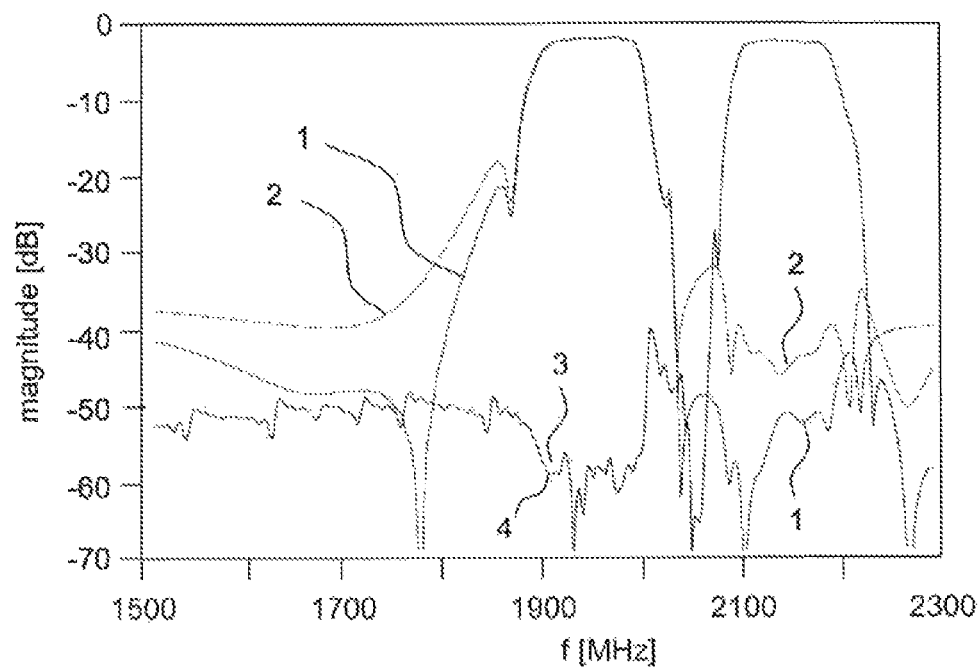
FIG. 14 shows the matrix elements $S_{12}$, $S_{23}$ for duplexers with and without a double coil.

FIG. 14 shows the magnitude of the matrix parameter $S_{12}$ of the transfer function of a duplexer, once with a double coil—curve 1—and once for a duplexer having a conventional single coil—curve 2. Curves 3 and 4 show the transfer function $S_{23}$ of the reception filter. In this case, curve 1 of the duplexer having a double coil exhibits a significantly improved blocking effect outside the TX passband, in particular in the reception frequency range. The transfer functions 3 and 4 show substantially no influence of the double coil on the transfer function of the reception filter.

Figure 15:
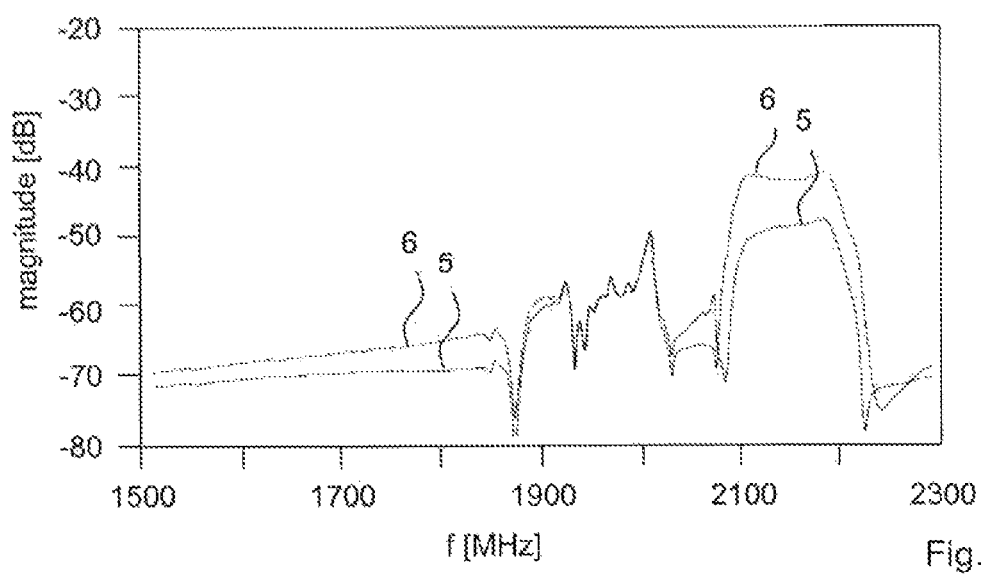
FIG. 15 shows the TX-RX isolation of a duplexer, once with and once without a double coil.

FIG. 15 shows the TX-RX isolation (matrix parameter $S_{13}$) with double coil—curve 1—and without double coil—curve 2. In this case, the isolation is significantly better if the double coil is present.

Figure 16:
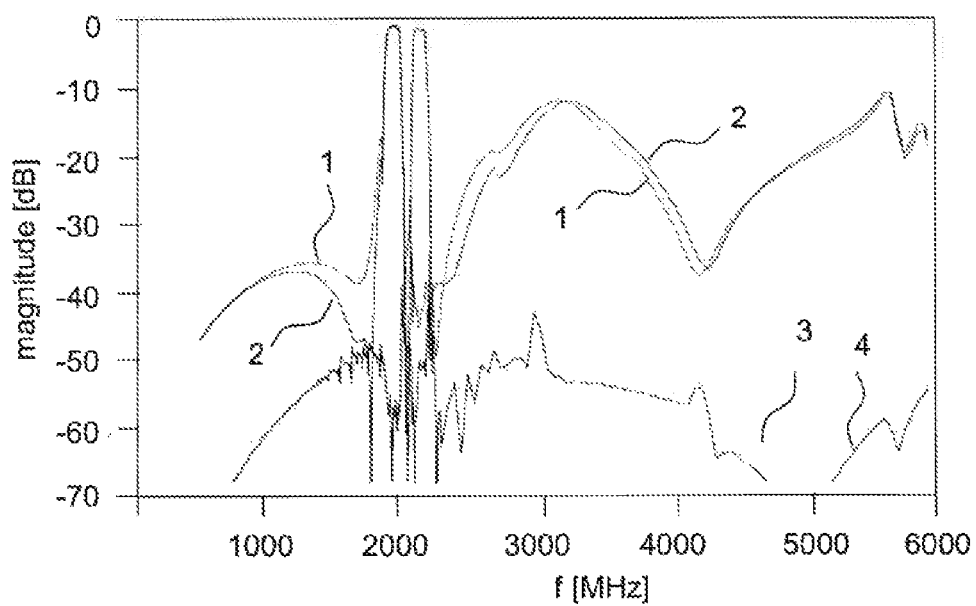
FIG. 16 shows the matrix parameters $S_{12}$, $S_{23}$ in a larger frequency range.

FIG. 16 shows the curves from FIG. 14, but in a further frequency range. It is possible to design the coil such that the transfer response far from the passband remains significantly unchanged.

Figure 17:
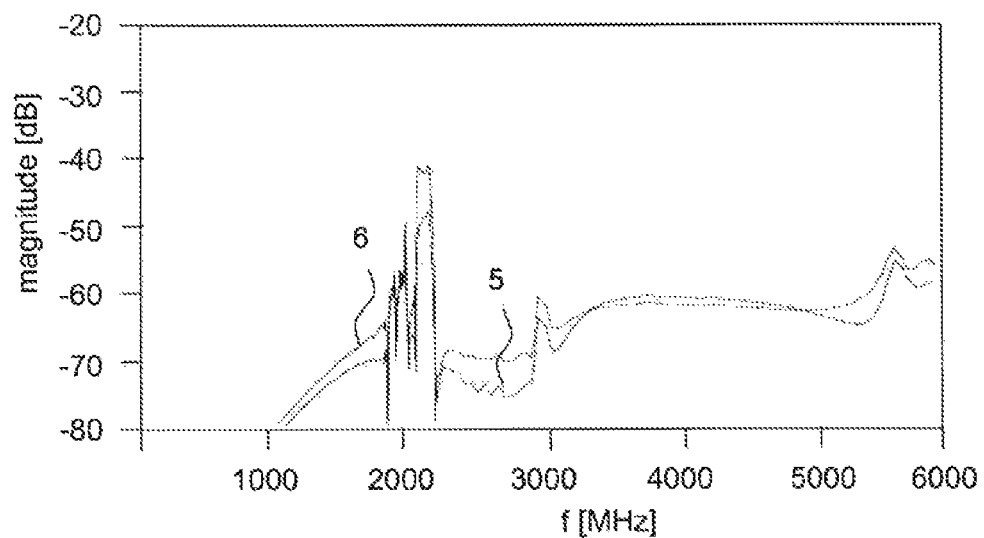
FIG. 17 shows the matrix element $S_{13}$ (TX-RX isolation) of a duplexer in a larger frequency range.

FIG. 17 shows the curves from FIG. 15 for a further frequency range.

Figure 18:
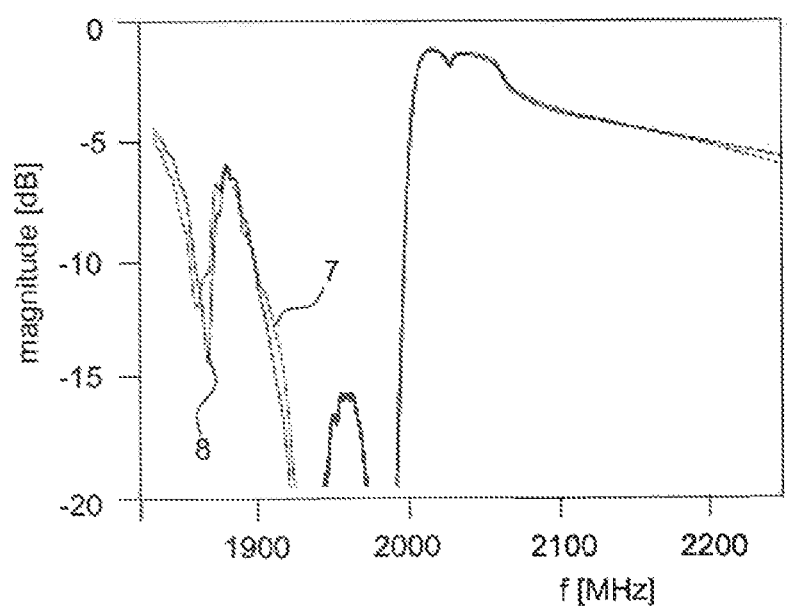
FIG. 18 shows the reflection at the TX input.

FIG. 18 shows the reflection (matrix element $S_{ii}$) at the transmitting connection of a duplexer. In this case, curve 1 shows the reflection of a duplexer with a double coil, while curve 2 shows the reflection of a duplexer with a conventional single coil.

Figure 19:
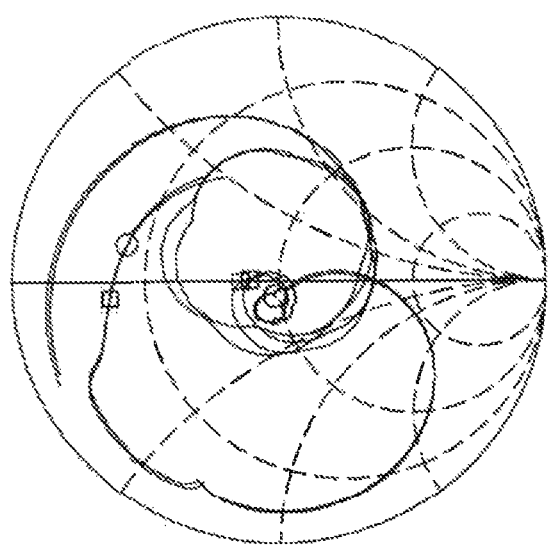
FIG. 19 shows the frequency-dependent input impedance at the TX input.

FIG. 19 shows a Smith chart with the frequency-dependent impedance of the transmitting connection for two duplexers, of which one has a double coil and the other has a conventional single coil. In this case, the characteristic impedances do not differ significantly.

Figure 20:
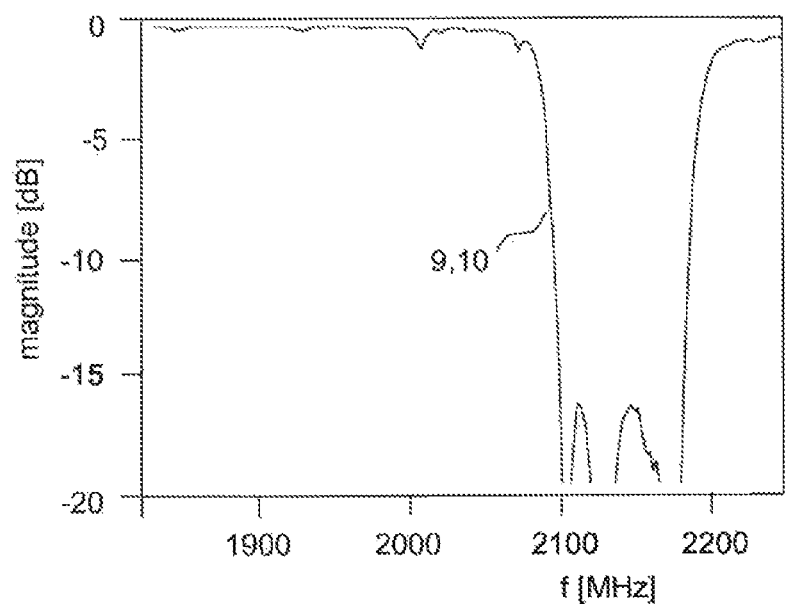
FIG. 20 shows the reflection at the RX output.

FIG. 20 shows the reflection of the antenna connection (matrix element $S_{33}$) for two duplexers, of which one has a double coil and the other has a conventional single coil. Both curve profiles are substantially identical, and so the double coil does not influence the reflection behavior at the antenna input.

Figure 21:
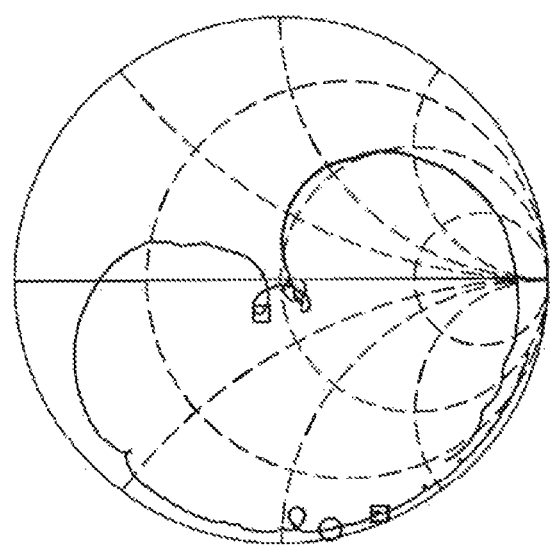
FIG. 21 shows the frequency-dependent impedance at the RX output.

FIG. 21 shows the frequency-dependent impedance for the duplexers from FIG. 20, wherein likewise no change in the impedance as a result of a coil is discernible.

Figure 22:
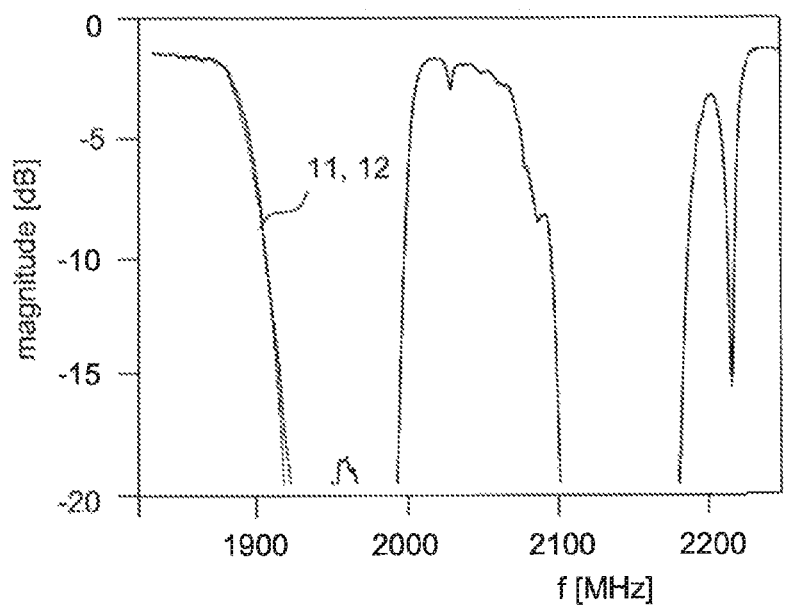
FIG. 22 shows the reflection at the antenna connection.

FIG. 22 shows the reflection at the receiving connection for two duplexers, of which one comprises a double coil and the other comprises a conventional single coil. The curves lie substantially one above the other, and so the double coil has no discernible effect on the reflection at the receiving connection.

Figure 23:
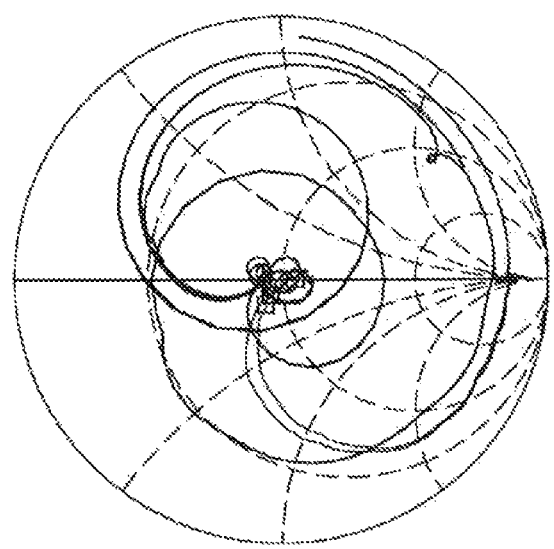
FIG. 23 shows the frequency-dependent impedance at the antenna connection.

FIG. 23 shows the frequency-dependent impedance at the receiving connection, once for a duplexer with a double coil and once for a duplexer with a single coil. No differences caused by the double coil are discernible at least in the relevant frequency range, i.e., in the range around 50Ω, the center of the Smith chart.

A component according to the invention is not restricted to any of the exemplary embodiments described here. Components comprising additional conductor sections, filters, impedance elements and combinations thereof likewise constitute exemplary embodiments according to the invention.

The invention claimed is:

1. An electrical RF component comprising:
   a housing;
   a micro acoustic filter having a ladder-type filter structure having a series branch resonator and a parallel branch resonator in the housing; and
   a double coil having a first coil segment and a second coil segment in the housing,
   wherein the first coil segment has an external turn segment having a first orientation and the second coil segment has an external turn segment having a second orientation in the opposite direction,
   wherein the external turn segments of the first and second coil segments are connected at a contact point,
   wherein the first and second coil segments are arranged without crossover and in a single layer, and
   wherein the double coil is arranged in proximity with the parallel branch resonator.

2. The electrical RF component according to claim 1, wherein the first coil segment is embodied in a spiral fashion.

3. The electrical RF component according to claim 2, wherein the second coil segment is embodied in a spiral fashion.

4. The electrical RF component according to claim 1, wherein the first coil segment is constructed with an m-gonal basic contour, and wherein m>=3.

5. The electrical RF component according to claim 1, wherein the first coil segment is constructed from n rectilinear conductor sections, and wherein n>=3.

6. The electrical RF component according to claim 1, wherein the first coil segment has an aspect ratio of less than 1.

7. The electrical RF component according to claim 1, wherein the first coil segment has an aspect ratio substantially equal to 1.

8. The electrical RF component according to claim 1, wherein the first coil segment has an aspect ratio greater than 1.

9. The electrical RF component according to claim 1, wherein the first coil segment has a first extent and the second coil segment has a second extent that differs from the first extent.

10. The electrical RF component according to claim 1, wherein the first coil segment has a first extent and the second coil segment has a second extent that is substantially equal to the first extent.

11. The electrical RF component according to claim 1, wherein the first coil segment has a first number of turns and the second coil segment has a second number of turns that is different than the first number of turns.

12. The electrical RF component according to claim 1, wherein the first coil segment has a number of turns and the second coil segment has the same number of turns.

13. The electrical RF component according to claim 1, wherein:
   the first coil segment has a center and the second coil segment has a center;
   a region of reduced electromagnetic coupling is determined by an axis that is perpendicular to a connecting line through both centers and runs through the contact point; and
   a component having a function sensitive toward inductive coupling is arranged in the region of reduced electromagnetic coupling.

14. The electrical RF component according to claim 13, wherein the region of reduced electromagnetic coupling comprises a double cone, and wherein the component function is arranged in a region of the double cone.

15. The electrical RF component according to claim 14, wherein the double cone has a half opening angle α, and where α<=50°.

16. A method for producing an electrical RF component according to claim 1, wherein both coil segments are formed in a common layer.

17. The method according to the claim 16, wherein the common layer is formed by deposition of 2 or more plies.

18. An electrical RF component comprising:
   a housing;
   a micro acoustic filter having a ladder-type filter structure having a series branch resonator and a parallel branch resonator in the housing; and
   a double coil having a first coil segment and a second coil segment in the housing, wherein the first coil segment has an external turn segment having a first orientation,
   wherein the second coil segment has an external turn segment having a second orientation in the opposite direction,
   wherein the external turn segments of the first and second coil segments are connected at a contact point,
   wherein the first and second coil segments are arranged without crossover and in a single layer,
   wherein the double coil is arranged in proximity to the parallel branch resonator, wherein the first coil segment has a center and the second coil segment has a center, wherein a region of reduced electromagnetic coupling is determined by an axis that is perpendicular to a connecting line through the centers of both the first and second coil segments and runs through the contact point, and wherein a component has a function sensitive toward inductive coupling is arranged in the region.

* * * * *